US009455343B2

(12) United States Patent
Pillarisetty et al.

(10) Patent No.: US 9,455,343 B2
(45) Date of Patent: Sep. 27, 2016

(54) HYBRID PHASE FIELD EFFECT TRANSISTOR

(71) Applicant: INTEL CORPORATION, Santa Clara, CA (US)

(72) Inventors: Ravi Pillarisetty, Portland, CA (US); Brian S. Doyle, Portland, OR (US); Elijah V. Karpov, Santa Clara, CA (US); David L. Kencke, Beaverton, OR (US); Uday Shah, Portland, OR (US); Charles C. Kuo, Hillsboro, OR (US); Robert S. Chau, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/040,574

(22) Filed: Sep. 27, 2013

(65) Prior Publication Data

US 2015/0091067 A1    Apr. 2, 2015

(51) Int. Cl.
H01L 29/78      (2006.01)
H01L 29/66      (2006.01)
H01L 45/00      (2006.01)
H01L 27/24      (2006.01)

(52) U.S. Cl.
CPC ........ *H01L 29/78* (2013.01); *H01L 29/66477* (2013.01); *H01L 29/66568* (2013.01); *H01L 27/2436* (2013.01); *H01L 29/785* (2013.01); *H01L 45/04* (2013.01); *H01L 45/1233* (2013.01); *H01L 45/146* (2013.01); *H01L 45/147* (2013.01); *H01L 2029/7858* (2013.01)

(58) Field of Classification Search
CPC ............. H01L 29/78; H01L 29/66477; H01L 29/0847; H01L 29/1079; H01L 29/4232; H01L 45/1233; H01L 27/2436; H01L 45/06

USPC ........ 257/288, 368, 369; 438/151, 197, 199
See application file for complete search history.

(56) References Cited

U.S. PATENT DOCUMENTS 6,835,650 B1 * 12/2004 McQueen ................ 438/631
8,043,888 B2    10/2011 Matthew et al.
2006/0266993 A1 * 11/2006 Suh ................ H01L 27/2436
                                                      257/4
2008/0073637 A1    3/2008 Kuh et al.
2008/0265321 A1   10/2008 Yu et al.

(Continued)

FOREIGN PATENT DOCUMENTS

TW    200830545    7/2008
TW    200843109   11/2008

OTHER PUBLICATIONS

Taiwan (R.O.C.) Patent Application No. 103130411, Search Report mailed Sep. 30, 2015 (with English translation) 2 pages.

(Continued)

*Primary Examiner* — Jarrett Stark
*Assistant Examiner* — Shahed Ahmed
(74) *Attorney, Agent, or Firm* — Blakely, Sokoloff, Taylor & Zafman LLP

(57) ABSTRACT

An insulating layer is deposited over a transistor structure. The transistor structure comprises a gate electrode over a device layer on a substrate. The transistor structure comprises a first contact region and a second contact region on the device layer at opposite sides of the gate electrode. A trench is formed in the first insulating layer over the first contact region. A metal-insulator phase transition material layer with a S-shaped IV characteristic is deposited in the trench or in the via of the metallization layer above on the source side.

13 Claims, 13 Drawing Sheets

(56) References Cited

U.S. PATENT DOCUMENTS

2012/0091424 A1  4/2012  Lin et al.
2013/0214234 A1*  8/2013  Gopalan ............... H01L 45/085
                                                              257/3
2014/0110765 A1*  4/2014  Murali .............. H01L 21/28088
                                                              257/288

OTHER PUBLICATIONS

Taiwan (R.O.C.) Patent Application No. 103130411, Notice of Allowance mailed Feb. 23, 2016 (with granted claims in English) 6 pages.

* cited by examiner

HYBRID PHASE FIELD EFFECT TRANSISTOR

FIELD

Embodiments of the invention relate to the field of electronic device manufacturing; and more specifically, to fabrication of transistor devices.

BACKGROUND

Generally, transistors are considered as the basis of modern electronics. Transistors typically used for switching in modern computers are based on the field effect. In such transistors, a voltage applied between the gate and drain electrodes increases the conductivity of a semiconductor, allowing electricity to flow between the source and drain electrodes. A transistor should ideally carry as little current as possible when there is no voltage between the gate and drain (the off state) and as much as possible when gate voltage is present (the on state). A low off current is important for energy efficiency, while a large on current is important because it allows circuits to run faster.

Therefore, an important measure of the quality of a transistor is the ratio of the current when the transistor is in on state ("ON" current) to the current when the transistor is in "OFF" state ("OFF" current). However, with a standard field-effect transistor (FET), this change in conductivity is influenced by only a thin layer close to where the current flows between gate and drain. This limits the ratio of on current to off current that can be achieved.

As transistor geometries shrink, the voltage that can be applied to the gate is reduced to maintain reliability. To maintain performance, the threshold voltage of the FET is reduced as well. As threshold voltage is reduced, the transistor cannot be switched from complete turn-off to complete turn-on with the limited voltage swing available. Typically, the circuit design is a compromise between strong current when the transistor is in the "ON" state and low current when the transistor is in the "OFF" state. Subthreshold leakage (including subthreshold conduction, gate-oxide leakage and reverse-biased junction leakage) typically can consume upwards of half of the total power consumption of high-performance integrated circuit chips.

In the subthreshold operating regime of the FET, when the gate voltage is lower than a threshold, the drain current versus gate voltage behavior is typically approximated by a linear curve. The slope of this curve is referred to as a subthreshold slope.

Conventional metal-oxide-semiconductor field effect transistors ("MOSFETs") typically have the subthreshold slope that is thermally limited to about 60 mV per decade. That is, for typical FET transistors increase of the gate voltage by about 60 mV causes increase the drain current by less than about a factor of 10. The limited subthreshold slope cannot provide fast transition between off (low current) and on (high current) states of the transistor.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

In the following description, numerous specific details, for example, specific materials, structures, dimensions of the elements, processes, etc. are set forth in order to provide thorough understanding of one or more embodiments of the present invention. It will be apparent, however, to one of ordinary skill in the art that the one or more embodiments of the present invention may be practiced without these specific details. In other instances, microelectronic device fabrication processes, techniques, materials, equipment, etc., have not been described in great details to avoid unnecessarily obscuring of this description. Those of ordinary skill in the art, with the included description, will be able to implement appropriate functionality without undue experimentation.

Reference throughout the specification to one embodiment or an embodiment means that a particular feature, structure, or characteristic described in connection with the embodiment is included in at least one embodiment. Thus, the appearance of the phrases in one embodiment or in an embodiment in various places throughout the specification are not necessarily all referring to the same embodiment. Furthermore, the particular features, structures, or characteristics may be combined in any suitable manner in one or more embodiments.

Methods and apparatuses to provide a hybrid phase field effect transistor ("FET") for low supply voltage (Vcc) logic and system-on-chip applications are described. A hybrid phase FET device comprises a metal-insulator phase transition material in a contact with a source/drain contact region of the transistor to achieve low leakage current when the transistor is in OFF state, steep subthreshold slope, and high drive currents. The transistor device comprising a metal-insulator phase transition material can be useful for low Vcc transistor/switch applications and for system-on-chip applications. By inserting a metal-insulator phase transition material in the source/drain contact region (or back end metallization) of a transistor a steep subthreshold turn "ON" slope is created, and the transistor switches ON substantially faster than a conventional transistor. In an embodiment, an insulating layer is deposited over a transistor structure. The transistor structure comprises a gate electrode over a device layer on a substrate; and a first contact region and a second contact region on the device layer at opposite sides of the gate electrode. A trench is formed in the first insulating layer over the first contact region. A metal-insulator phase transition material layer is deposited in the trench.

Figure 1:
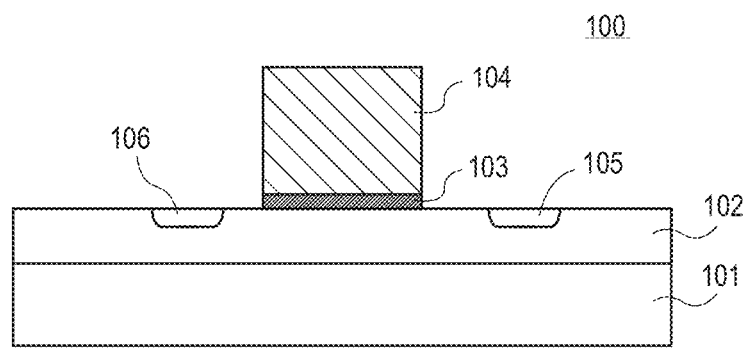
FIG. 1 is a cross-sectional view of a portion of a hybrid phase transistor structure according to one embodiment.

FIG. 1 is a cross-sectional view 100 of a portion of a hybrid phase transistor structure according to one embodiment. The hybrid phase transistor structure comprises a device layer 102 on a substrate 101. In one embodiment, substrate 101 includes a monocrystalline silicon (Si), germanium (Ge), silicon germanium (SiGe), a III-V materials, e.g., GaAs, InSb, GaP, GaSb based materials, carbon nanotubes based materials, or any combination thereof. In one embodiment, the substrate 101 comprises a single crystalline material substrate, e.g., monocrystalline silicon substrate. In one embodiment, the substrate 101 comprises a polycrystalline material substrate. In an embodiment, substrate 101 includes interconnects, for example, vias, configured to connect to one or more metallization layers.

In one embodiment, substrate 101 is a semiconductor-on-isolator (SOI) substrate including a bulk lower substrate, a middle insulation layer, and a top monocrystalline layer. The top monocrystalline layer may comprise any material listed above for the bulk monocrystalline substrate. In an embodiment, device layer 102 is a part of the top monocrystalline layer of the SOI substrate 101.

Device layer 102 may comprise a monocrystalline silicon (Si), germanium (Ge), silicon germanium (SiGe), a III-V materials, e.g., gallium arsenide (GaAs) based materials, or any combination thereof. In one embodiment, the device layer 102 comprises a polycrystalline, nanocrystalline or an amorhous thin film. In an embodiment, the device layer 102 includes one or more semiconductor fins formed on the substrate 101. In one embodiment, the transistor structure is coupled to one or more layers of metallization (not shown). The one or more metallization layers can be separated from adjacent metallization layers by dielectric material, e.g., interlayer dielectric (ILD) (not shown). The adjacent metallization layers may be electrically interconnected by vias (not shown). In an embodiment, a tri-gate transistor array including multiple transistors, such as transistor 100 can be formed on any well-known insulating substrate such as substrates formed from silicon dioxide, nitrides, oxides, and sapphires.

A gate dielectric layer 103 is deposited on device layer 102. A gate electrode 104 is deposited on gate dielectric layer 103. Gate dielectric layer 103 can be any well-known gate dielectric layer. In one embodiment, gate dielectric layer 103 comprises a high-k dielectric material having a dielectric constant greater than the dielectric constant of silicon dioxide. In one embodiment, gate dielectric layer 103 comprises a metal oxide dielectric. For example, gate dielectric layer 103 can be but not limited to tantalum pentaoxide ($Ta_2O_5$), and titanium oxide ($TiO_2$) zirconium oxide ($ZrO_2$), hafnium oxide ($HfO_2$), lanthanum oxide ($La_2O_4$), lead zirconium titanate (PZT), other high-k dielectric material, or a combination thereof.

In an embodiment, the gate dielectric layer 103 is a silicon dioxide ($SiO_2$), silicon oxynitride ($SiO_xN_y$) or a silicon nitride ($Si_3N_4$) dielectric layer. In an embodiment, the thickness of the gate dielectric layer 103 is in the approximate range between about 2 Å to about 100 Å.

Gate electrode 104 can be formed of any suitable gate electrode material. In an embodiment, gate electrode 104 comprises of polycrystalline silicon doped to a concentration density between $1\times10^{19}$ atoms/cm$^3$ to $1\times10^{20}$ atoms/cm$^3$. In an embodiment, the gate electrode can be a metal gate electrode, such as but not limited to, tungsten, tantalum, titanium, and their nitrides. It is to be appreciated, the gate electrode 104 need not necessarily be a single material and can be a composite stack of thin films, such as but not limited to a polycrystalline silicon/metal electrode or a metal/polycrystalline silicon electrode.

A contact region 105 and a contact region 106 are formed on the device layer 102 at opposite sides of the gate electrode 104. In an embodiment, contact region 105 comprises a source region, and contact region 106 comprises a drain region. In another embodiment, contact region 105 comprises a drain region, and contact region 106 comprises a source region. The source and drain regions are formed of the same conductivity type such as N-type or P-type conductivity. In an embodiment, the source and drain regions have a doping concentration of between $1\times10^{19}$, and $1\times10^{21}$ atoms/cm$^3$. The source and drain regions can be formed of uniform concentration or can include sub-regions of different concentrations or doping profiles such as tip regions (e.g., source/drain extensions). In an embodiment, the source and drain regions have the same doping concentration and profile. In an embodiment, the doping concentration and profile of the source and drain regions can vary in to obtain a particular electrical characteristic.

The portion of the device layer 102 located between the source region and drain regions, defines a channel region of the transistor. The channel region can also be defined as the area of the fin surrounded by the gate electrode 104. At times however, the source/drain region may extend slightly beneath the gate electrode through, for example, diffusion to define a channel region slightly smaller than the gate electrode length (Lg). In an embodiment, the channel region is intrinsic or undoped. In an embodiment, the channel region is doped, for example to a conductivity level of between $1\times10^{16}$ to $1\times10^{19}$ atoms/cm$^3$. In an embodiment, when the channel region is doped it is typically doped to the opposite conductivity type of the source region and the drain region. For example, when the source and drain regions are N-type conductivity the channel region would be doped to p type conductivity. Similarly, when the source and drain regions are P type conductivity the channel region would be N-type conductivity. In this manner transistor 100 can be formed into either a NMOS transistor or a PMOS transistor respectively. The channel region can be uniformly doped or can be doped non-uniformly or with differing concentrations to provide particular electrical and performance characteristics. For example, the channel region can include well-known halo regions, if desired.

Figure 11:
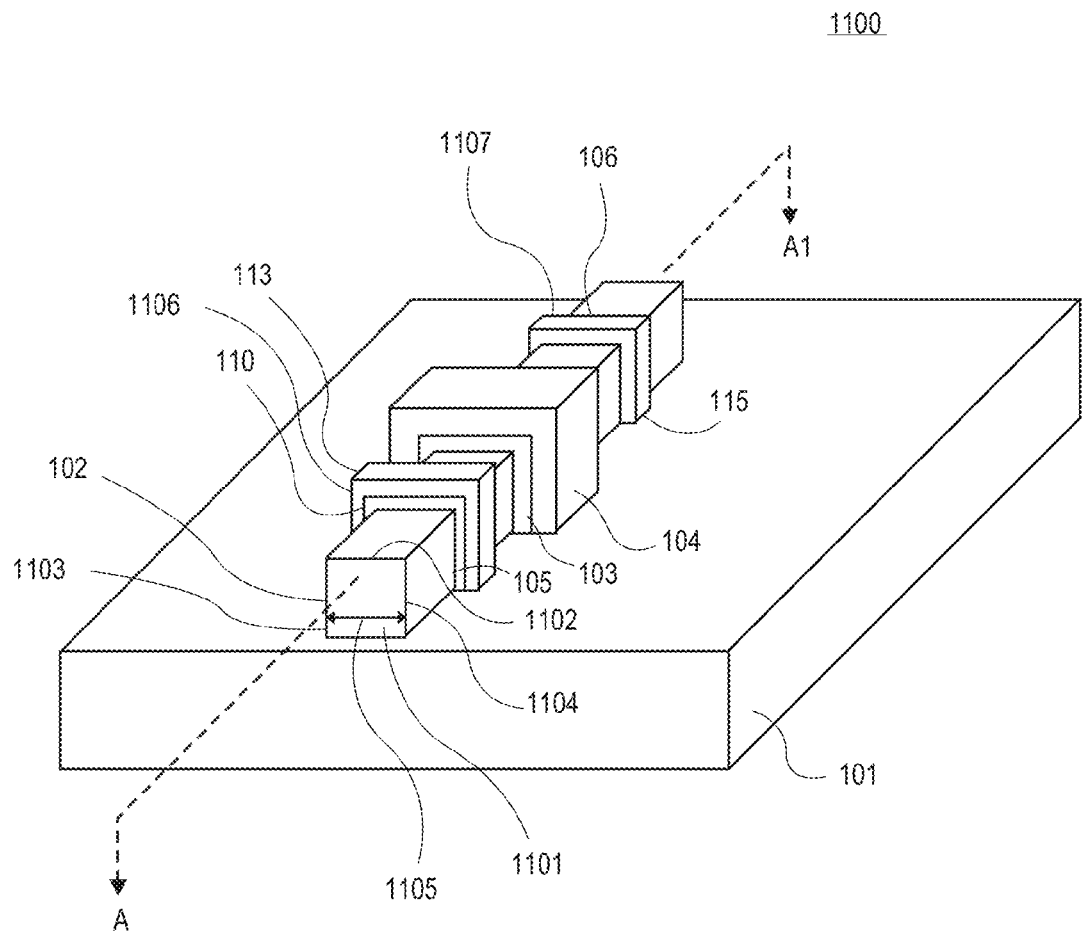
FIG. 11 is a perspective view of a tri-gate transistor structure according to one embodiment.

FIG. 11 is a perspective view of a tri-gate transistor structure 1100 according to one embodiment. Device layer 102 comprising a fin 1101 is formed on substrate 101. The cross-sectional view of a portion of the tri-gate transistor structure 1100 along A-A1 axis is depicted in FIG. 1. In an embodiment, tri-gate transistor 1100 is a part of a tri-gate transistor array that includes multiple tri-gate transistors formed on substrate 101.

In an embodiment, an electrically insulating e.g., a shallow trench isolation (STI) layer is formed on substrate 101 adjacent to fin 1101 to provide field isolation regions that isolate one electronic device from other devices on substrate 101. Shallow trench isolation layers are known to one of ordinary skill in the art of electronic device manufacturing.

In one embodiment, the electrically insulating layer formed on substrate 101 adjacent to fin 1101 comprises an interlayer dielectric (ILD), e.g., silicon dioxide. In one embodiment, the electrically insulating layer formed on substrate 101 adjacent to fin 1101 includes polyimide, epoxy, photodefinable materials, such as benzocyclobutene (BCB), and WPR-series materials, or glass. In one embodiment, the electrically insulating layer formed on substrate 101 adjacent to fin 1101 is a low permittivity (low-k) ILD layer. Typically, low-k is referred to the dielectrics having dielectric constant (permittivity k) lower than the permittivity of silicon dioxide.

As shown in FIG. 11, the fin 1101 protrudes from a top surface of the substrate 101. Fin 1101 has height that can be defined as a distance between a top surface of the substrate 101 and a top surface 1102 of the fin. In one embodiment, the height of the fin 1101 is from about 500 Å to about 5,000 Å. In one embodiment, fin 1101 comprises a semiconductor material that is degenerately doped. In another embodiment, fin 1101 is made electrically conducting through silicidation, or the like. Fin 1101 can be formed of any well-known semiconductor material, such as but not limited to silicon (Si), germanium (Ge), silicon germanium (Si$_x$Ge$_y$), gallium arsenide (GaAs), InSb, GaP, GaSb and carbon nanotubes. Fin 1101 can be formed of any well-known material which can be reversibly altered from an insulating state to a conductive state by applying external electrical controls. In one embodiment, fin 1101 is a single crystalline material fin. In one embodiment, fin 1101 is a polycrystalline material fin. As shown in FIG. 11, fin 1101 has a pair of opposing sidewalls 1103 and 1104 separated by a distance which defines a semiconductor fin width 1105. In one embodiment, the fin width 1105 is in an approximate range from about 5 nm to about 50 nm. In one embodiment, the length of the fins is greater than the width and is determined by a design. In one embodiment, the length of the fins is from about 50 nm to hundreds of microns.

As shown in FIG. 11, gate dielectric layer 103 is deposited on and around three sides of the fin 1101. Gate dielectric layer 103 is formed on or adjacent to sidewall 1103, on top surface 1102 and on or adjacent to sidewall 1104 of fin 1101.

As shown in FIG. 11, gate electrode 104 is deposited on the gate dielectric layer 103 on the fin 1101. Gate electrode 104 is formed on and around the gate dielectric layer 103 as shown in FIG. 11. Gate electrode 104 is formed on or adjacent to gate dielectric 103 formed on sidewall 1103 of semiconductor fin 1101, is formed on gate dielectric 103 formed on the top surface 1102 of semiconductor fin 1101, and is formed adjacent to or on gate dielectric layer 103 formed on sidewall 1104 of semiconductor fin 1101. As shown in FIG. 11, gate electrode 104 has a pair of laterally opposite sidewalls separated by a distance which defines the gate length of the fin transistor.

Contact region 105 and contact region 106 are formed at opposite sides of the gate electrode 104 in fin 1101, as shown in FIG. 11. As shown in FIG. 11, tri-gate transistor 1100 has a dielectric and a gate electrode surrounding the fin 1103 on three sides that provides three channels, one channel extends between the source and drain regions on one sidewall of the fin, such as sidewall 1103, a second channel extends between the source and drain regions on the top surface of the fin, such as surface 1102, and the third channel extends between the source and drain regions on the other sidewall of the fin, such as sidewall 1104.

In an embodiment, the source regions of the transistor 1100 are electrically coupled to higher levels of metallization (e.g., metal 1, metal 2, metal 3, and so on) to electrically interconnect various transistors of the array into functional circuits.

Figure 2:
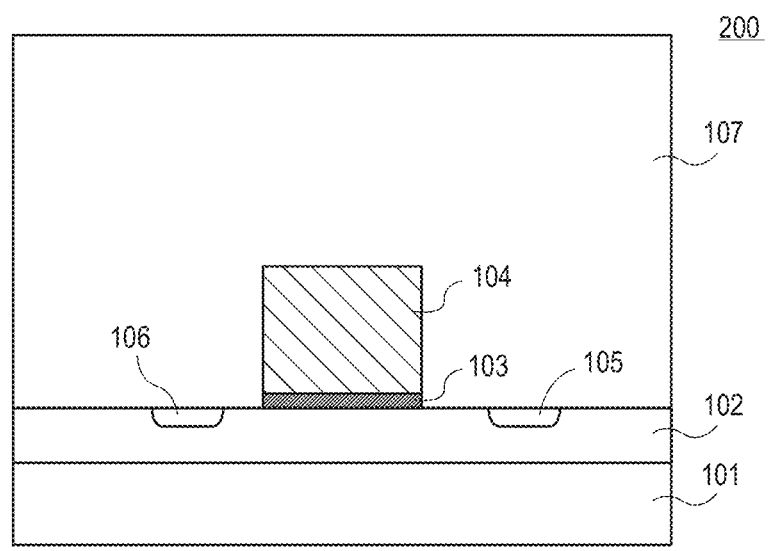
FIG. 2 is a cross-sectional view similar to FIG. 1 after an insulating layer is deposited over the transistor structure according to one embodiment.

FIG. 2 is a cross-sectional view 200 similar to FIG. 1 after an insulating layer is deposited over the transistor structure according to one embodiment. An insulation layer 107 is deposited over the transistor structure comprising gate electrode 104 on gate dielectric layer 103 on device layer 102 on substrate 101. As shown in FIG. 2, insulating layer 107 is deposited on contact region 105 and contact region 106 formed on the device layer 102 at opposite sides of the gate electrode 104.

In an embodiment, insulating layer 107 can be any material suitable to insulate adjacent devices and prevent leakage from the fins. In one embodiment, insulating layer 107 is an interlayer dielectric (ILD), e.g., silicon dioxide, or any other electrically insulating layer determined by a design. In one embodiment, the thickness of the insulating layer 107 is in the approximate range of 500 angstroms (Å) to 10,000 Å. The insulating layer 107 can be blanket deposited over the transistor structure using any of techniques known to one of ordinary skill in the art of electronic device manufacturing, such as but not limited to a chemical vapour deposition (CVD), and a physical vapour deposition (PVP).

Figure 3:
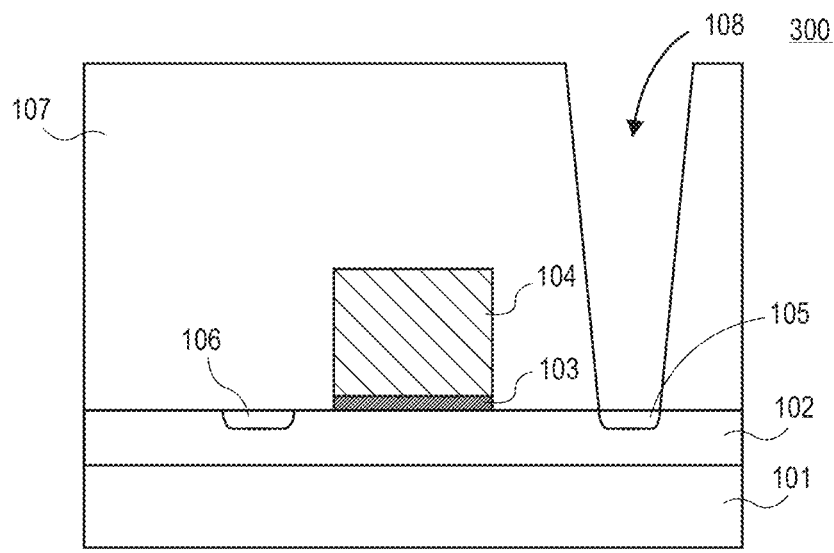
FIG. 3 is a cross-sectional view similar to FIG. 2 after a trench in the insulating layer is formed over one of the contact regions according to one embodiment.

FIG. 3 is a cross-sectional view 300 similar to FIG. 2 after a trench in the insulating layer is formed over one of the contact regions according to one embodiment. As shown in FIG. 3, a trench 108 is selectively formed in insulating layer 107 to expose contact region 105. In an embodiment, contact region 105 comprises a source region, and contact region 106 comprises a drain region of the transistor. In another embodiment, contact region 105 comprises a drain region, and contact region 106 comprises a source region of the transistor. In an embodiment, the trench 108 is formed by patterning and etching insulating layer 107 using any suitable patterning and etching techniques known to one of ordinary skill in the art of electronic device manufacturing.

In an embodiment, a patterned layer is deposited on the insulating layer 107 to selectively form trench 108 to expose contact region 105, while the contact region 106 is being protected by insulating layer 107. In an embodiment, the patterned layer is a patterned photoresist. In an embodiment, the patterned layer is a patterned hard mask. The hard mask can be a silicon dioxide layer or a high k metal oxide dielectric layer, for example, titanium oxide, hafnium oxide, or aluminum oxide. The hard mask may be formed by any suitable process, such as but not limited to chemical vapor deposition (CVD), physical vapor deposition (PVD) or atomic layer deposition (ALD). The patterned layer may be formed using any of suitable photolithography techniques known in the art of electronic device manufacturing. Insulating layer 107 can be etched down to contact region 105 using any suitable etching technique, e.g., a dry etch or wet etch known to one of ordinary skill in the art of electronic device manufacturing.

Figure 4:
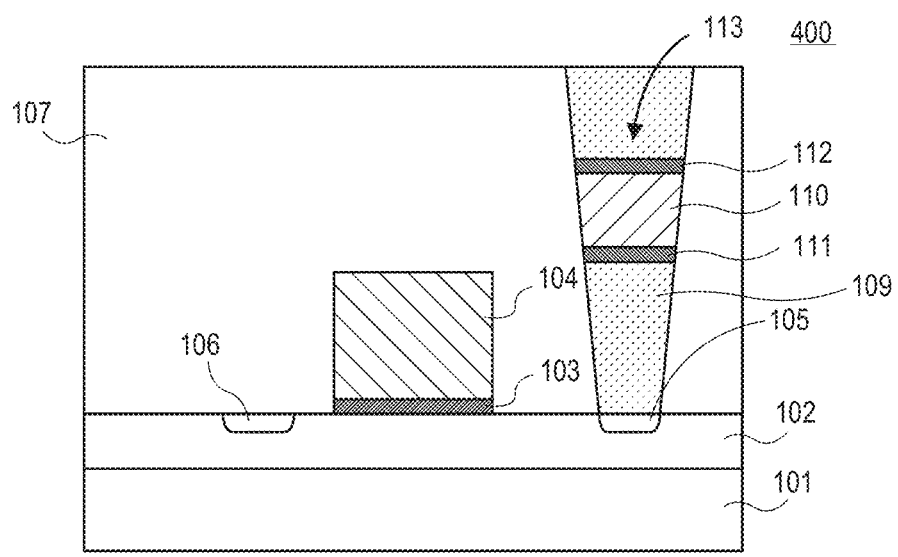
FIG. 4 is a view similar to FIG. 3, after a metal-insulator phase transition material layer is deposited over one of the contact regions exposed through the trench according to one embodiment.

FIG. 4 is a view 400 similar to FIG. 3, after a metal-insulator phase transition material layer is deposited over one of the contact regions exposed through the trench according to one embodiment. A metal-insulator phase transition material layer 110 is deposited over contact region 105. In an embodiment, contact region is a source region, and the metal-insulator phase transition material layer 110 is deposited over the source region. In another embodiment, contact region is a drain region, and the metal-insulator phase transition material layer 110 is deposited over the drain region. The transistor device having metal-insulator phase transition material deposited over at least one of the source/drain region provides many advantages over the conventional transistor devices. For example, the transistor device having metal-insulator phase transition material deposited over at least one of the source/drain region has a sub-threshold slope characteristic that is substantially steeper due to the metal-insulator transition than the sub-threshold slope characteristic of the transistor device without the metal-insulator phase transition material. The OFF current (e.g., when voltage is not supplied to the gate electrode) of the transistor device having metal-insulator phase transition material deposited over at least one of the source/drain region is set by high resistance of the metal-insulator phase transition material in the insulating state so that the leakage current of the transistor is substantially reduced. The ON current (e.g., when voltage is supplied to the gate electrode) of the transistor device having metal-insulator phase transition material deposited over at least one of the source/drain region is set by maximum current that the transistor can drive.

Figure 19:
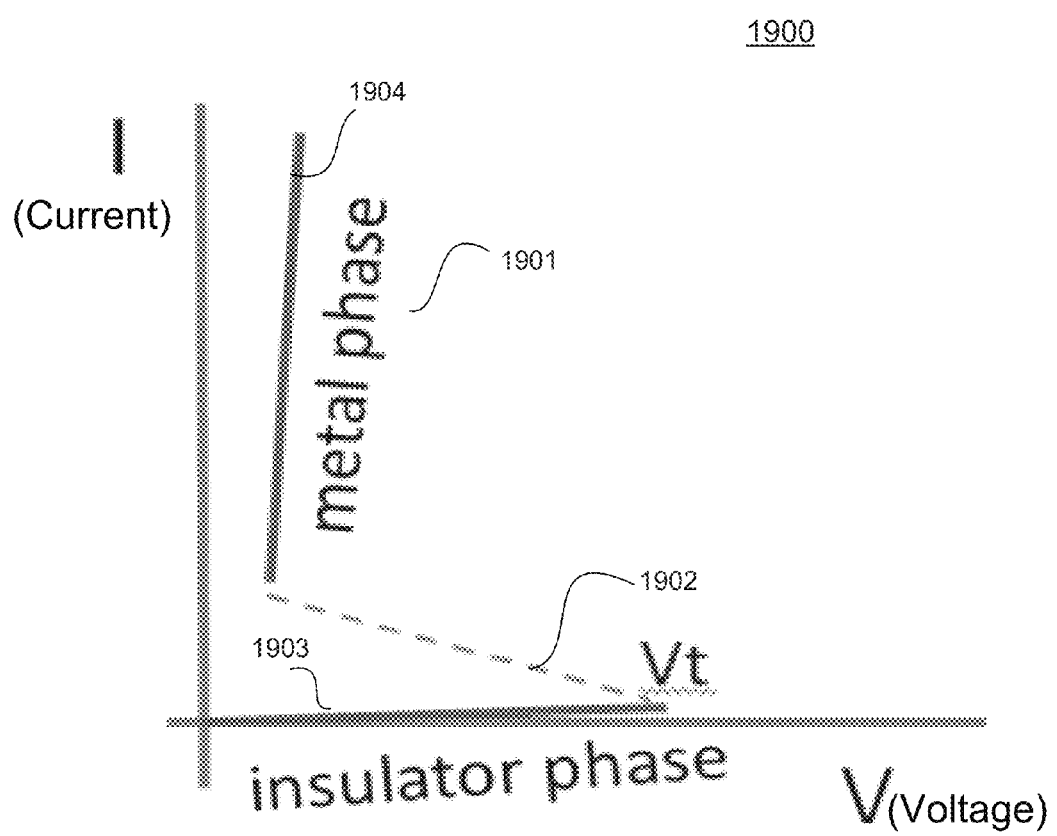
FIG. 19 shows a graph illustrating an exemplary S-shaped IV characteristic for a metal-insulator phase transition material layer according to one embodiment.

In an embodiment, the transistor device having the metal-insulator phase transition material layer 110 integrated into the source region is more effective than the transistor device having the metal the metal-insulator phase transition material layer 110 integrated into the drain region. Generally, the metal-insulator phase transition material refers to an insulator material that becomes a conductor if an external excitation such as temperature, pressure or electrical field applied to the material. Generally, the metal-insulator phase transition effect is referred to as a Mott transition in the sense that a S-shaped current-voltage ("IV") characteristic is observed when voltage is applied across the material. FIG. 19 shows a graph 1900 illustrating an exemplary S-shaped IV characteristic for a metal-insulator phase transition material layer according to one embodiment.

As shown in FIG. 19, a S-shaped IV characteristic 1901 exhibits a snapback 1902 at a threshold voltage Vt, at which transition from an insulator phase 1903 to a metal phase 1904 takes place.

In an embodiment, the metal-insulator phase transition material layer 110 is a single or multi-component oxide system that contains one or more metals from periods 3, 4, or 5 of the periodic table, and has partially filled valence d-shells. In an embodiment, the metal-insulator phase transition material layer 110 behaves as an insulator (e.g., with only negligible leakage current) in the OFF-state when unbiased, and acts as a metal (e.g., conducting high current) at a relatively low bias in the ON-state. The transition is reversible: when the bias is removed or otherwise no longer satisfied, the metal-insulator phase transition material returns to its original insulating state. In an embodiment, the metal-insulator phase transition layer 110 is vanadium oxide ($VO_2$), $NbO_2$, titanium oxide (e.g., $Ti_2O_3$, $Ti_3O_5$), a material described by formulation of $ABO_3$, for example, a perovskite material, for example, $SmNiO_3$ and $LaCoO_3$, or any combination thereof. In an embodiment, the thickness of the metal-insulator phase transition material layer 110 is from about 2 nanometers ("nm") to about 100 nm In an embodiment, the steepness of the sub-threshold slope of the current-voltage characteristic of the transistor increases as the thickness of the metal-insulator phase transition material layer increases. In an embodiment, when the thickness of the metal-insulator phase transition material layer increases, the voltage at which the transistor is turned "ON" decreases. In an embodiment, when the thickness of the metal-insulator phase transition material layer increases, the leakage current of the transistor decreases. In an embodiment, when the area of the metal-insulator phase transition material layer decreases, the leakage current of the transistor decreases.

In an embodiment, a contact layer 109 is deposited on the exposed contact region 105 in trench 108. Contact layer 109 can be deposited on the exposed contact region 105 using a sputtering, chemical vapor deposition ("CVD"), molecular beam epitaxy ("MBE"), an atomic layer deposition ("ALD"), any other deposition technique, or a combination thereof. Metal capping layer 111 is deposited on contact layer 109. Metal capping layer 111 can be deposited on contact layer 109 using any of a sputtering technique, chemical vapor deposition ("CVD"), molecular beam epitaxy ("MBE"), an atomic layer deposition ("ALD"), or other deposition technique.

Metal-insulator phase transition material layer 110 is deposited on metal capping layer 111. Metal-insulator phase transition material layer 110 can be selectively deposited on cappinglayer 111, such as metal or conductive oxide, using any of a sputtering technique, chemical vapor deposition ("CVD"), molecular beam epitaxy ("MBE"), an atomic layer deposition ("ALD"), or other deposition technique. A capping layer 112 is deposited on metal-insulator phase transition material layer 110. Capping layer 112, such as metal or conductive oxide, can be deposited on metal-insulator phase transition material layer 110 using any of a sputtering technique, chemical vapor deposition ("CVD"), molecular beam epitaxy ("MBE"), an atomic layer deposition ("ALD"), or other deposition technique. In an embodiment, capping layer 111 and capping layer 112 act as electrodes to the metal-insulator phase transition material layer 110.

In an embodiment, each of the capping layer 111 and capping layer 112 contains one or more metals which are not reactive with oxygen, for example, Pd, Pt, one or more metals which form conductive oxides, for example, W, V, Cr, Ir, one or more conductive oxides for example, Indium Tin Oxide ("ITO"), $La_{1-x}Sr_xGa_{1-y}Mg_yO_{3-X-0.5(x+y)}$ ("LSGMO"), conductive substoichiometric oxides of metals for example, TiOx, or any combination thereof. In an embodiment, each of the capping layer 111 and capping layer 112 is deposited to the thickness from about 2 nm to about 50 nm.

As shown in FIG. 4, a contact layer 109 is adjacent to metal-insulator phase transition material layer 110. In an embodiment, the thickness of the contact layer 109 is from about 500 Å to about 10000 Å.

As shown in FIG. 4, the metal-insulator phase transition material layer 110 deposited through trench 108 is embedded into the contact region 105. A contact layer 113 is deposited onto metal capping layer 112. The contact layer 113 can be blanket deposited onto metal capping layer 112 using any of deposition techniques known to one of ordinary skill in the art of electronic device manufacturing for example, a sputtering, chemical vapor deposition ("CVD"), molecular beam epitaxy ("MBE"), an atomic layer deposition ("ALD"), any other deposition technique, or a combination thereof, and then polished back to be planar with the top surface of insulating layer 107. The contact layer 113 can be polished back using, for example, a chemical-mechanical polishing ("CMP") technique known to one of ordinary skill in the art of electronic device manufacturing. In an embodiment, the thickness of the contact layer 113 is from about 500 Å to about to about 10000 Å.

In an embodiment, each of the contact layer 109 and contact layer 113 is a conductive layer including a metal for example, Indium (In), tin (Sn), lead (Pb), silver (Ag), antimony (Sb), Bismuth (Bi), zinc (Zn), Cadmium (Cd), gold (Au), copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), platinum Pt, or any combination thereof. In an embodiment, a stack comprising contact layer 113 on capping layer 112 on metal-insulator phase transition material layer 110 on metal capping layer 111 on contact layer 109 is a contact to the source region of the transistor. In another embodiment, a stack comprising contact layer 113 on metal capping layer 112 on metal-insulator phase transition material layer 110 on metal capping layer 111 on contact layer 109 is a contact to the drain region of the transistor.

Figure 5:
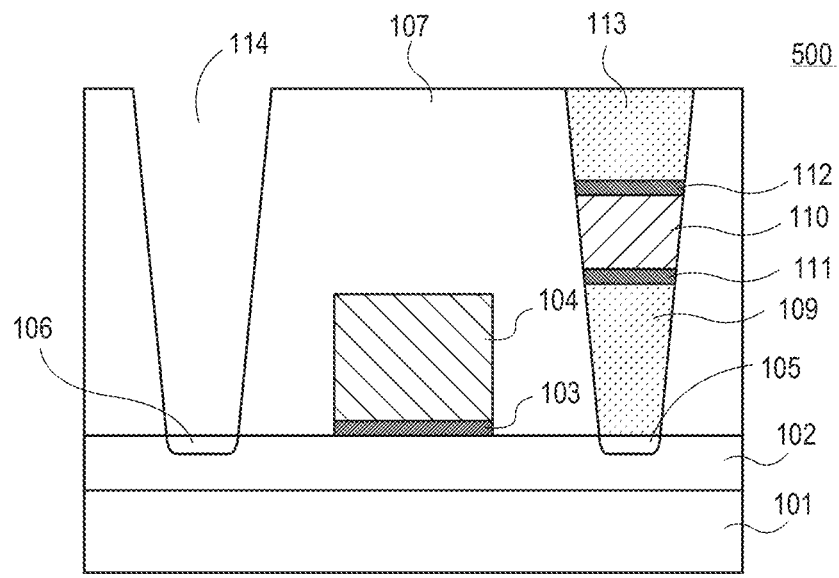
FIG. 5 is a view similar to FIG. 4, after a trench is formed to expose a contact region according to one embodiment.

FIG. 5 is a view 500 similar to FIG. 4, after a trench 114 is formed to expose contact region 106 according to one embodiment. As shown in FIG. 5, a trench 114 is formed selectively to expose contact region 106 after the contact region 105 is covered by the source contact including metal-insulator phase transition material layer 110. In an embodiment, the trench 114 is formed by patterning and etching insulating layer 107 using any suitable patterning and etching techniques known to one of ordinary skill in the art of electronic device manufacturing. In an embodiment, a patterned hard mask is deposited on the insulating layer 107 to selectively form trench 114 to expose contact drain region 106, while contact source region 105 is covered by the contact layer 113. Insulating layer 107 can be etched through the patterned hard mask down to contact region 106 using any suitable etching technique, e.g., a dry etch or wet etch known to one of ordinary skill in the art of electronic device manufacturing.

Figure 6:
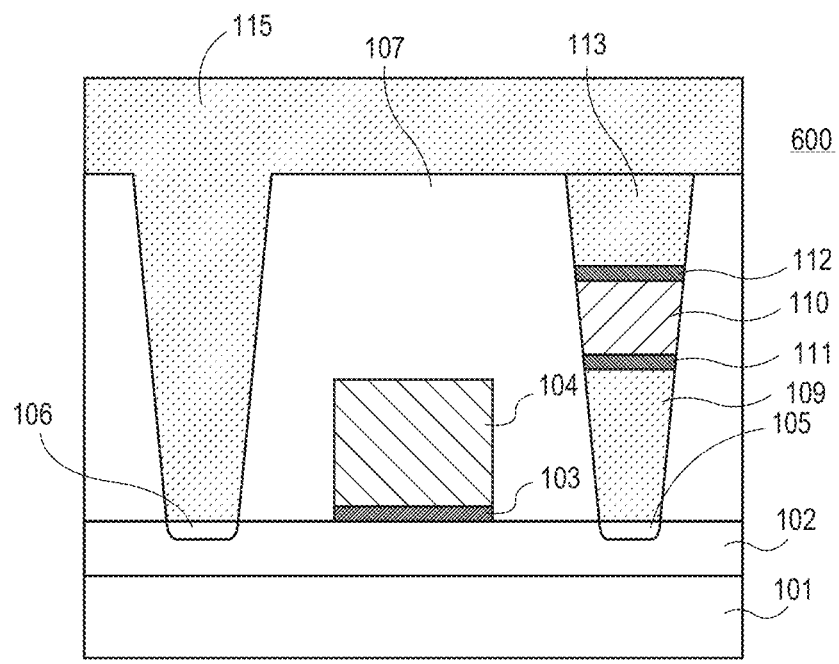
FIG. 6 is a view similar to FIG. 5, after a contact layer is formed through the trench on the contact region according to one embodiment.

FIG. 6 is a view similar to FIG. 5, after a contact layer 115 is formed through trench 114 on contact region 106 according to one embodiment. In one embodiment, contact region 106 is a drain region, and the contact layer 115 is deposited on the drain region. In an embodiment, contact region 106 is a source region, and the contact layer 115 is deposited on the source region. In one embodiment, the contact layer 115 is blanket deposited on contact region 106 exposed through the trench 114 using any of deposition techniques known to one of ordinary skill in the art of electronic device manufacturing for example, a sputtering technique, chemical vapor deposition ("CVD"), molecular beam epitaxy ("MBE"), an atomic layer deposition ("ALD"), or any other deposition technique. In an embodiment, contact layer 115 is a conductive layer including a metal for example, Indium (In), tin (Sn), lead (Pb), silver (Ag), antimony (Sb), Bismuth (Bi), zinc (Zn), Cadmium (Cd), gold (Au), copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), platinum Pt, or any combination thereof.

Figure 7:
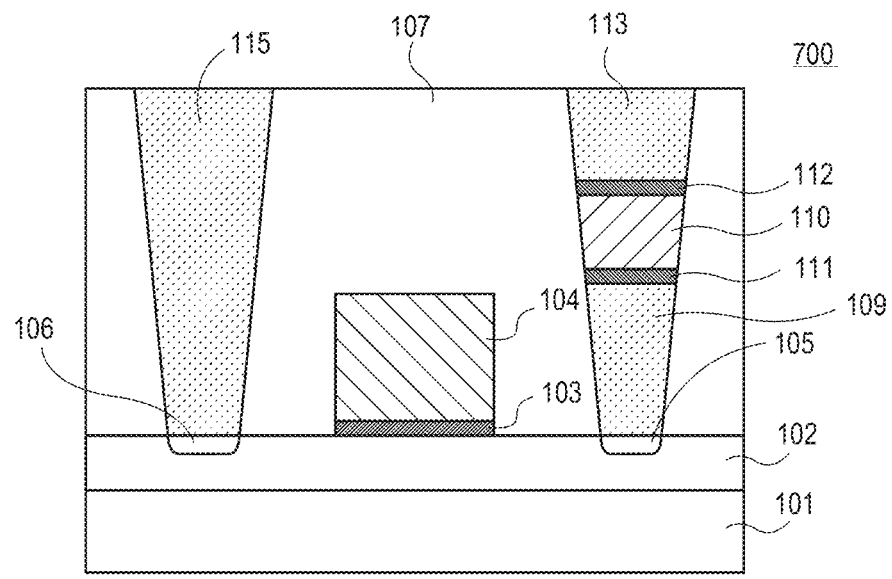
FIG. 7 is a view similar to FIG. 6, after the contact layer is polished back to expose the top surface of insulating layer according to one embodiment.

FIG. 7 is a view 700 similar to FIG. 6, after the contact layer 115 is polished back to expose the top surface of insulating layer 107 according to one embodiment. As shown in FIG. 7, contact layer 115 is planar with the top surface of insulating layer 107. Contact layer 115 can be polished back, for example, by using a chemical-mechanical polishing ("CMP") technique known to one of ordinary skill in the art of electronic device manufacturing. In an embodiment, the thickness of the contact layer 113 is from about 500 Å to about 10000 Å. In an embodiment, contact layer 115 is a low resistance contact to the drain region of the transistor. In another embodiment, contact layer 115 is a low resistance contact to the source region of the transistor.

Figure 8:
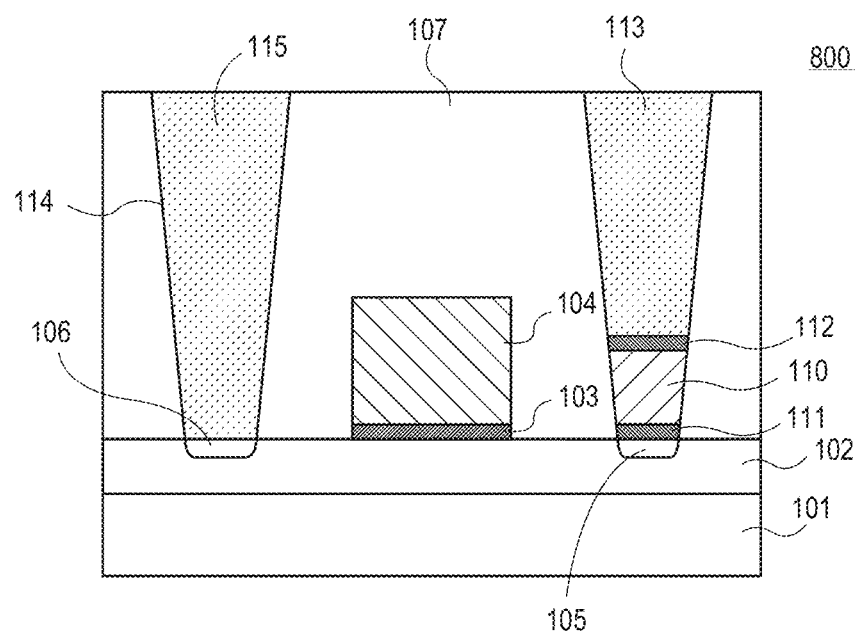
FIG. 8 is a view similar to FIG. 3, after a metal-insulator phase transition material layer is deposited over the contact region according to another embodiment.

FIG. 8 is a view 800 similar to FIG. 3, after metal-insulator phase transition material layer 110 is deposited over the contact region 105 according to another embodiment. FIG. 8 is different from FIG. 4 in that the metal capping layer 111 is adjacent to the contact region 105. Metal capping layer 111 can be deposited on contact region 105 using any of a sputtering technique, chemical vapor deposition ("CVD"), molecular beam epitaxy ("MBE"), an atomic layer deposition ("ALD"), or other deposition technique. In an embodiment, a stack comprising contact layer 113 on metal capping layer 111 on metal-insulator phase transition material layer 110 on metal capping layer 109 is a contact to the source region of the transistor. In another embodiment, a stack comprising contact layer 113 on metal capping layer 111 on metal-insulator phase transition material layer 110 on metal capping layer 109 is a contact to the drain region of the transistor.

Figure 9:
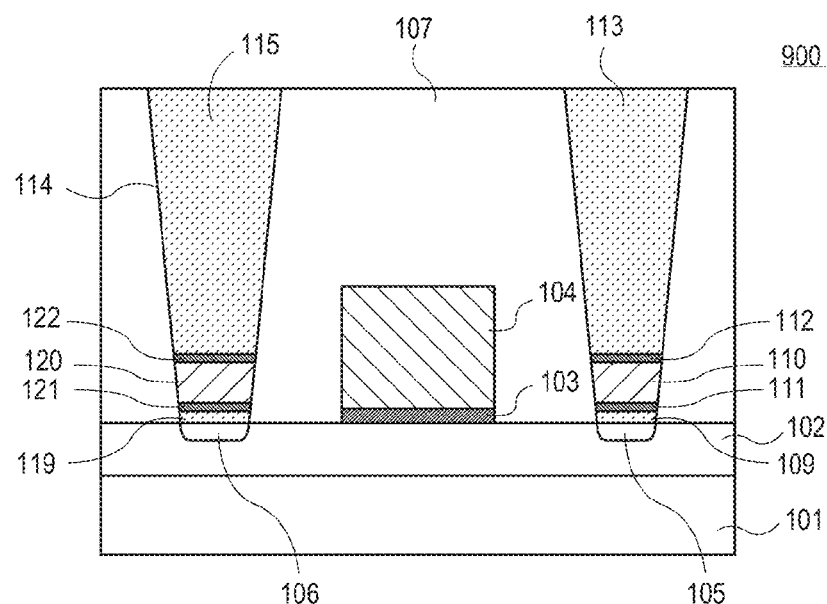
FIG. 9 is a view similar to FIG. 5, after the metal-insulator phase transition material layer is deposited over the contact region and then polished back to expose the top surface of the insulating layer according to another embodiment.

FIG. 9 is a view 900 similar to FIG. 5, after a metal-insulator phase transition material layer 120 is deposited over the contact region 106 and then polished back to expose the top surface of the insulating layer 107 according to another embodiment. FIG. 9 is different from FIG. 7 in that the metal-insulator phase transition material layer is deposited over both the contact region 105 and the contact region 106. As shown in FIG. 9, a contact layer 119 is deposited on the exposed contact region 106 in trench 114. In an embodiment, contact region 106 is a drain contact region. In an embodiment, contact layer 119 is one of the contact layers as described above and can be deposited on the exposed contact region 106 using any of the contact layer deposition techniques, as described above. A metal capping layer 121 is deposited on contact layer 119. In an embodiment, metal capping layer 121 is one of the metal capping layers as described above and is deposited using one of the metal capping layer deposition techniques as described above. A metal-insulator phase transition material layer 120 is deposited on metal capping layer 121. In an embodiment, metal-insulator phase transition material layer 120 is one of the metal-insulator phase transition material layers as described above and is deposited using any of the metal-insulator phase transition material layer deposition techniques as described above.

A metal capping layer 122 is deposited on metal-insulator phase transition material layer 120. In an embodiment, metal capping layer 122 is one of the metal capping layer as described above and is deposited using one of the metal capping layer deposition techniques as described above. In an embodiment, contact layer 115 is deposited onto metal capping layer 122 using any of deposition techniques known to one of ordinary skill in the art of electronic device manufacturing for example, a sputtering, chemical vapor deposition ("CVD"), molecular beam epitaxy ("MBE"), an atomic layer deposition ("ALD"), any other deposition technique, or a combination thereof, and then polished back to be planar with the top surface of insulating layer 107. The contact layer 115 can be polished back using, for example, a CMP technique known to one of ordinary skill in the art of electronic device manufacturing. In an embodiment, a stack comprising contact layer 115 on metal capping layer 122 on metal-insulator phase transition material layer 120 on metal capping layer 121 on contact layer 119 provides a contact to the drain region of the transistor, and a stack comprising contact layer 113 on metal capping layer 112 on metal-insulator phase transition material layer 110 on metal capping layer 111 on contact layer 109 provides a contact to the source region of the transistor. In an embodiment, contact layers 119 and 109 are omitted, and metal capping layers 121 and 111 are deposited directly onto contact region 106 and contact region 105 respectively using any of the deposition techniques, as described above with respect to FIG. 8.

Referring back to FIG. 11, a stack 1106 comprising contact layer 113 is formed over the contact region 105, as described above. A stack 1107 comprising contact layer 115 is deposited over the contact region 106, as described above. As shown in FIG. 11, each of the stacks 1106 and 1107 is deposited on and around all three sides of the fin 1101, such as sidewalls 1104 and 1103, and top surface 1102. In an embodiment, at least one of contact layer 113 and contact layer 115 is deposited over the metal-insulator phase material layer (not shown), as described above.

In one embodiment, contact region 105 is a source region, and contact region 106 is a drain region. In an embodiment, stack 1106 comprises contact layer 113 on capping layer 112 on metal-insulator phase transition material layer 110 on metal capping layer 111 on contact layer 109 (as shown for example in FIG. 4). In an embodiment, stack 1106 is a contact to the source region of the transistor, as described above. In an embodiment, stack 1107 comprises contact layer 115 on metal capping layer 122 on metal-insulator phase transition material layer 120 on metal capping layer 121 on contact layer 119 (as shown for example in FIG. 9). In an embodiment, stack 1107 is a contact to the drain region of the transistor.

Figure 10:
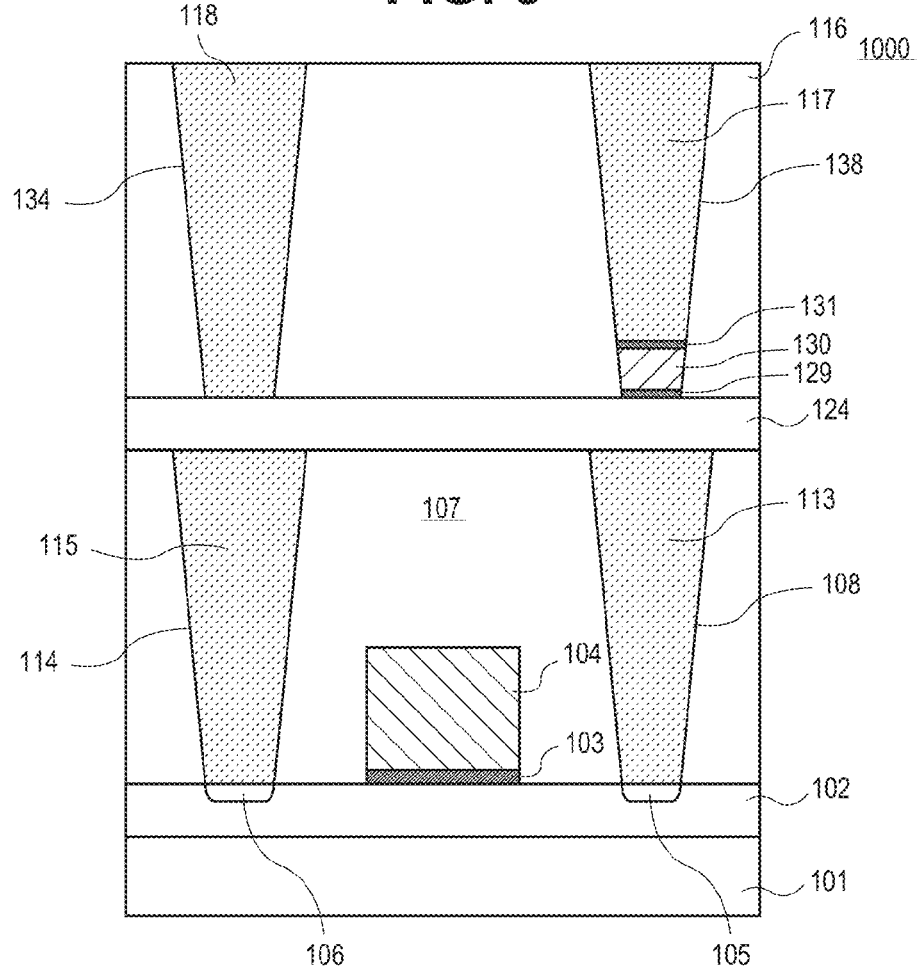
FIG. 10 is a view similar to FIG. 2, after a metallization layer is formed on the insulating layer according to one embodiment.

FIG. 10 is a view 1000 similar to FIG. 2, after a metallization layer 124 is formed on insulating layer 107 according to one embodiment. In an embodiment, metallization layer 124 is a part of a back end metallization of the electronic device. In an embodiment, the metallization layer includes a metal, for example, a metal for example, Indium (In), tin (Sn), lead (Pb), silver (Ag), antimony (Sb), Bismuth (Bi), zinc (Zn), Cadmium (Cd), gold (Au), copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), platinum Pt, or any combination thereof.

In an embodiment, the metallization layer 124 includes interconnects, vias, and metal lines configured to connect to other metallization layers (not shown). In an embodiment, metallization layer 124 is configured to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing.

As shown in FIG. 10, contact layer 115 is formed through trench 114 on contact region 106 and contact layer 113 is formed through trench 108 on contact region 105 using any of deposition techniques known to one of ordinary skill in the art, as described above. In an embodiment, contact region 105 is a source contact region, and contact region 106 is a drain region. In another embodiment, contact region 105 is a drain region, and contact region 106 is a source region. An insulating layer 116 is deposited on metallization layer 124. In an embodiment, insulating layer 116 can be any material suitable to insulate adjacent devices and prevent leakage from the fins. In one embodiment, insulating layer 116 is an interlayer dielectric (ILD), e.g., silicon dioxide, or any other electrically insulating layer determined by a design. In one embodiment, the thickness of the insulating layer 116 is in the approximate range of 500 angstroms (Å) to 10,000 Å. The insulating layer 116 can be blanket deposited onto metallization layer 124 using any of techniques known to one of ordinary skill in the art of electronic device manufacturing, such as but not limited to a chemical vapour deposition (CVD), and a physical vapour deposition (PVP).

As shown in FIG. 10, a capping layer 129 is deposited through a trench 138 in insulating layer 116 on the exposed portion of the metallization layer 124. In an embodiment, capping layer 129 is one of the capping layers, as described above and is deposited on the exposed portion of the metallization layer 124 using any of the metal capping layer deposition techniques as described above. Metal-insulator phase transition material layer 130 is deposited on capping layer 129. In an embodiment, metal-insulator phase transition material layer 130 is one of the metal-insulator phase transition material layers as described above and is deposited using any of the metal-insulator phase transition material layer deposition techniques as described above.

A capping layer 131 is deposited on metal-insulator phase transition material layer 130. In an embodiment, 1 capping layer 131 is one of the capping layers as described above and is deposited using any of the capping layer deposition techniques as described above. Contact layer 117 is deposited onto capping layer 131. In an embodiment, contact layer 117 is one of the capping layers as described above and is deposited onto capping layer 131 using any of the contact layer deposition techniques as described above, and then polished back to be planar with the top surface of insulating layer 116.

As shown in FIG. 10, a stack comprising contact layer 117 on metal capping layer 131 on metal-insulator phase transition material layer 130 on metal capping layer 129 is formed on metallization layer 124 through trench 138 in insulating layer 116 to provide an electrical contact via contact layer 113 to the contact region 105 of the transistor. The metal-insulator phase transition material layer 130 deposited through trench 138 is embedded into the metallization layer 124 over the contact region 105 to increase the steepness of the sub-threshold slope of the current-voltage characteristic of the transistor, decrease the leakage current of the transistor, and to maximize the operating current of the transistor, as described above.

As shown in FIG. 10, a contact layer 118 is formed through a trench 134 in insulating layer 116 on the exposed portion of the metallization layer 124 to provide an electrical contact via contact layer 115 to the contact region 106 of the transistor. In an embodiment, contact layer 118 is one of the contact layers as described above. In an embodiment, contact layer 118 is deposited onto the exposed portion of the metallization layer 124 using any of the contact layer deposition techniques as described above. In an embodiment, contact layer 118 is then polished back to be planar with the top surface of insulating layer 116, as described above.

Figure 12:
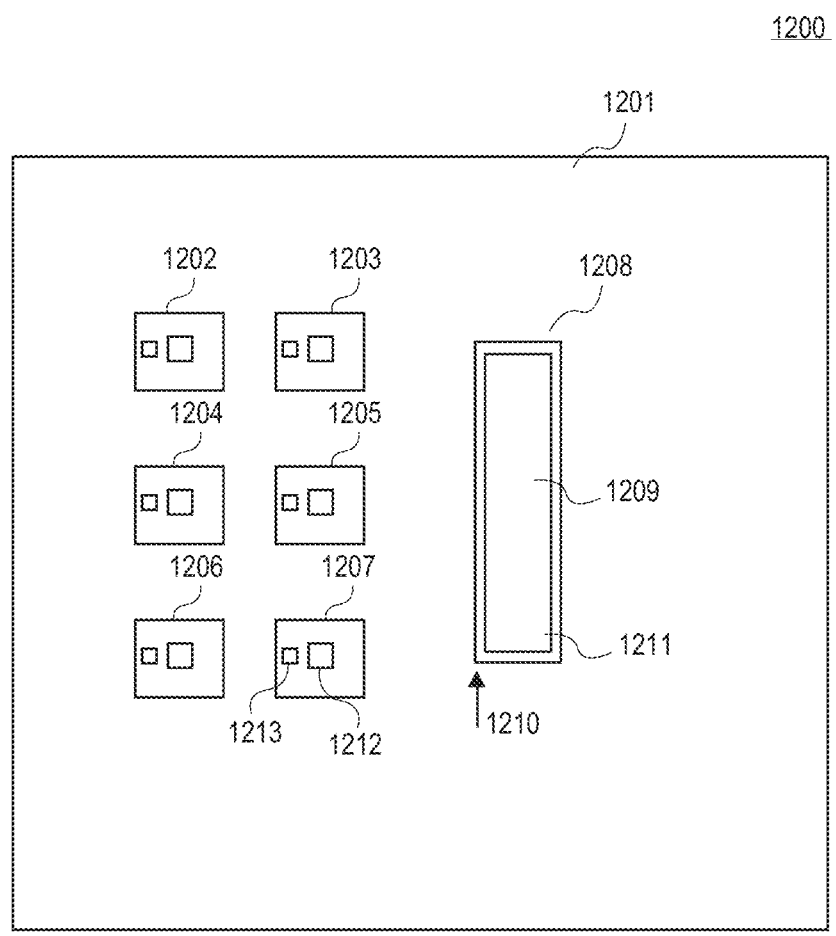
FIG. 12 is a top view of a system on a chip comprising a transistor array comprising a plurality of transistors according to one embodiment.

FIG. 12 is a top view 1200 of a system on a chip comprising a transistor array comprising a plurality of transistors according to one embodiment. Transistors 1202, 1203, 1204, 1205, 1206, and 1207 are formed on a substrate 1201. In an embodiment, substrate 1201 is one of the substrates as described above. In an embodiment, each of the transistors 1202, 1203, 1204, 1205, 1206, and 1207 comprises a gate electrode and a drain contact region, such as a gate electrode 1212 and a drain contact region 1213, as described above. A source region 1208 is formed on substrate 1208. In an embodiment, source region 1208 is a common source region for the transistors 1202, 1203, 1204, 1205, 1206, and 1207. A metal-insulator phase transition material layer 1209 is deposited over the common source region 1208. In an embodiment, a metal-insulator phase transition material layer 1209 is one of the metal-insulator phase transition material layers as described above and is deposited over the common source region 1208 using any of the metal-insulator phase transition material layer deposition techniques as described above. In an embodiment, an area size 1211 of the metal-insulator phase transition material layer 1209 is not less than the area size of the common source region 1208. In an embodiment, when the area size of the metal-insulator phase transition material layer 1209 increases, the voltage at which the transistor is turned "ON" decreases. In an embodiment, as the area size of the metal-insulator phase transition material layer 1209 decreases, the leakage current of the transistor decreases.

Figure 13:
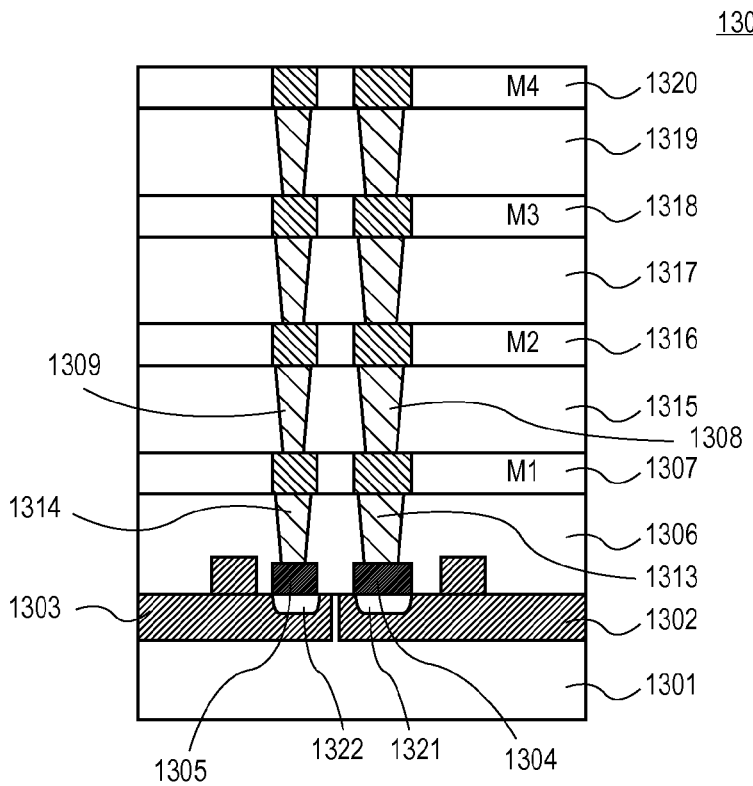
FIG. 13 is a cross-sectional view of an electronic device system according to one embodiment.

FIG. 13 is a cross-sectional view 1300 of an electronic device system according to one embodiment. The electronic device system comprises an insulating layer 1306 over a transistor structure 1301 and a transistor structure 1302 over a substrate 1301, as described above. Each of the transistor structures 1301 and 1302 comprises a gate electrode over a device layer on a substrate 1301, and a source contact region and a drain contact region on the device layer at opposite sides of the gate electrode, as described above. In an embodiment, the metal-insulator phase transition material layer is embedded into one or more of the source/drain regions of the transistor structures. As shown in FIG. 13, a stack comprising a contact layer 1313 on a metal capping layer on a metal-insulator phase transition material layer 1304 on a metal capping layer is deposited through the trench in the insulating layer 1306 on a source/drain contact region 1321 of transistor structure 1302, as described above. A stack comprising a contact layer 1314 on a metal capping layer on a metal-insulator phase transition material layer 1305 on a metal capping layer is deposited through the trench in the insulating layer 1306 on a source/drain contact region 1322 of transistor structure 1303, as described above. As shown in FIG. 13, the source/drain contact regions of transistor structures 1301 and 1302 are coupled via interconnects 1313 and 1314 to higher levels of metallization, such as a metallization layer 1307 ("M1"), a metallization layer 1311 ("M2"), a metallization layer 1318 ("M3"), and a metallization layer 1320 ("M 4") via interconnects formed in the insulating layers deposited between the respective metallization layers.

As shown in FIG. 13, an insulation layer 1306 is deposited over the transistor structures 1301 and 1302 and underneath the metallization layer 1307. An insulation layer 1315 is deposited between the metallization layer 1307 and metallization layer 1311. An insulation layer 1317 is deposited between the metallization layer 1311 and metallization layer 1318. An insulation layer 1319 is deposited between the metallization layer 1318 and metallization layer 1320. The metallization layers 1307, 1311, 1318, and 1320 are electrically connected via respective interconnects formed in each of the insulating layers 1306, 1311, 1318, and 1318, such as an interconnect 1308 and an interconnect 1309, as shown in FIG. 13. The metallization layers 1307, 1311, 1318, and 1320 are used to electrically interconnect various components of the integrated circuit together into functional circuits, as known to one of ordinary skill in the art of electronic device manufacturing. As shown in FIG. 13, the metal-insulator phase transition material layer 1304 is embedded into the contact region of the transistor structure 1301, and metal-insulator phase transition material layer 1305 is embedded into the contact region of the transistor structure 1302.

Figure 14:
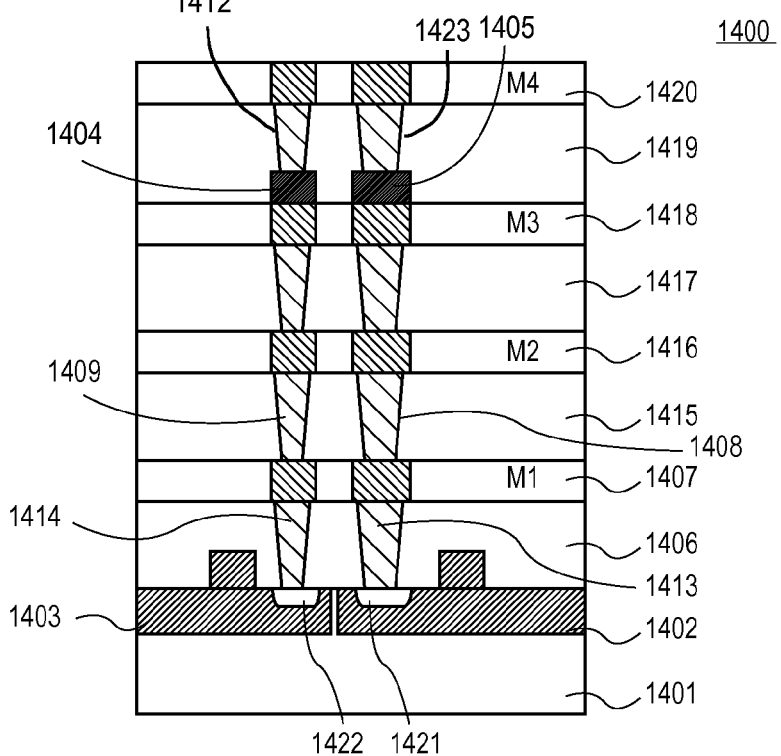
FIG. 14 is a cross-sectional view of an electronic device system according to another embodiment.

FIG. 14 is a cross-sectional view 1400 of an electronic device system according to another embodiment. The electronic device system comprises an insulating layer 1406 over a transistor structure 1403 and a transistor structure 1402 over a substrate 1401, as described above. Each of the transistor structures 1403 and 1402 comprises a gate electrode over a device layer on a substrate 1401, and a source contact region and a drain contact region on the device layer at opposite sides of the gate electrode, as described above. A contact layer 1413 is deposited through the trench in insulating layer 1406 on the exposed source/drain contact region 1421 of the transistor structure 1402. A contact layer 1414 is deposited through the trench in the insulating layer 1406 over the source/drain contact region 1422 of the transistor structure 1403. As shown in FIG. 14, the contact regions 1421 and 1422 are coupled via interconnects 1413 and 1414 to higher levels of metallization, such as a metallization layer 1407 ("M1"), a metallization layer 1411 ("M2"), a metallization layer 1418 ("M3"), and a metallization layer 1420 ("M4") via interconnects formed in the insulating layers deposited between the respective metallization layers. As shown in FIG. 14, an insulation layer 1406 is deposited over the transistor structures 1401 and 1402 and underneath the metallization layer 1407. An insulation layer 1415 is deposited between the metallization layer 1407 and metallization layer 1416. An insulation layer 1417 is deposited between the metallization layer 1416 and metallization layer 1418. An insulation layer 1419 is deposited between the metallization layer 1418 and metallization layer 1420. The metallization layers 1407, 1416, 1418, and 1420 are electrically connected via respective interconnects formed in each of the insulating layers 1406, 1416, 1417, and 1419, such as an interconnect 1408 and an interconnect 1409, as shown in FIG. 14. The metallization layers 1407, 1416, 1418, and 1420 are used to electrically interconnect various components of the integrated circuit together into functional circuits, as known to one of ordinary skill in the art of electronic device manufacturing. In an embodiment, the metal-insulator phase transition material layer is embedded into the contact region of one or more of the metallization layers to provide an electrical contact to the contact region of the transistor. As shown in FIG. 14, a stack comprising a contact layer 1412 on a metal capping layer (not shown) on a metal-insulator phase transition material layer 1404 on a metal capping layer (not shown) is deposited through the trench in the insulating layer 1419 on the exposed portion of the metallization layer 1418. A stack comprising a contact layer 1423 on a metal capping layer (not shown) on a metal-insulator phase transition material layer 1405 on a metal capping layer (not shown) is deposited through the trench in the insulating layer 1419 on the exposed portion of the metallization layer 1418. As shown in FIG. 14, the metal-insulator phase transition material layer 1404 is embedded into the contact region of the metallization layer 1418, and metal-insulator phase transition material layer 1405 is embedded into the contact region of the metallization layer 1418.

Figure 15:
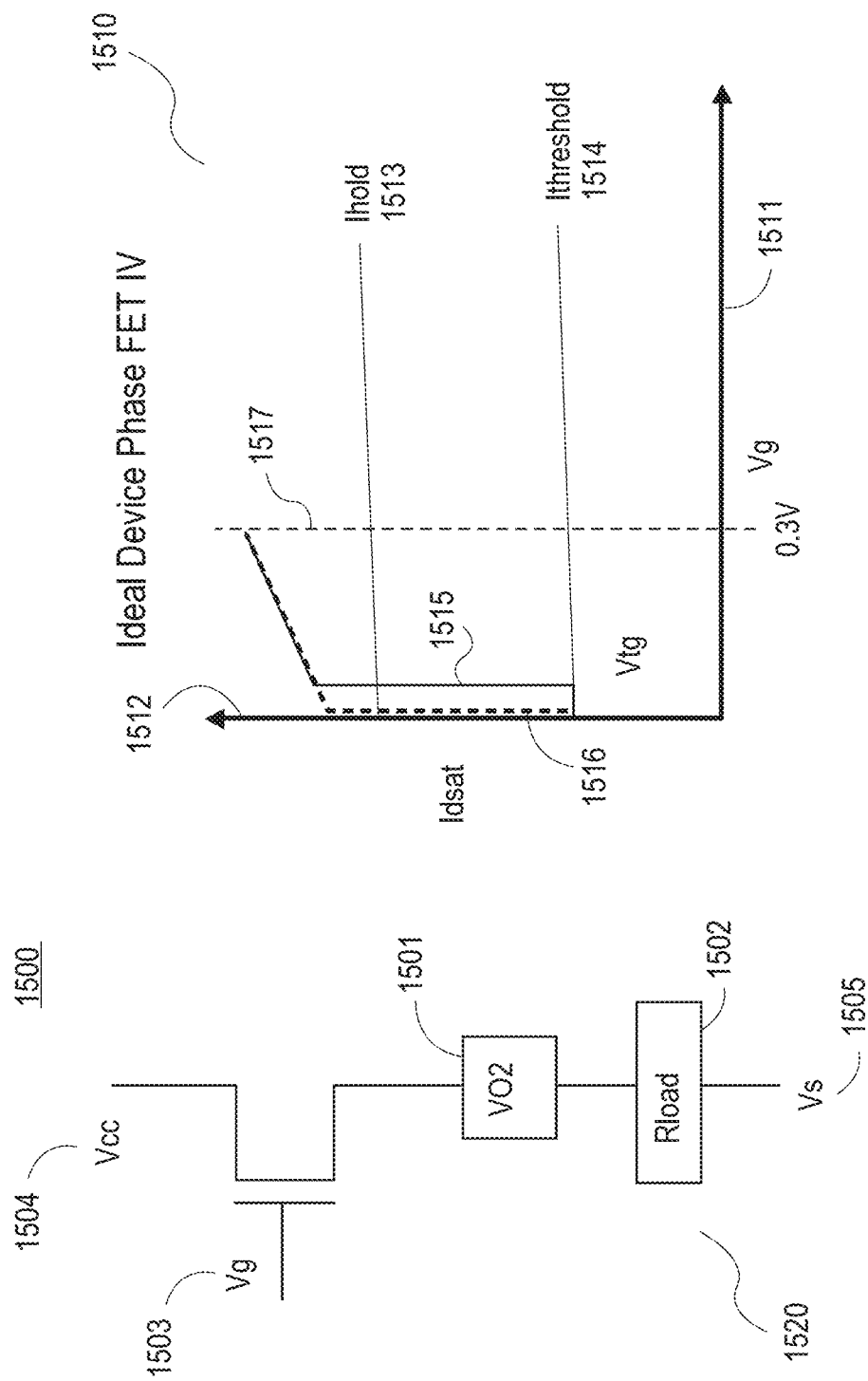
FIG. 15 illustrates an equivalent circuit and a current-voltage characteristic graph of a hybrid phase FET according to one embodiment.

FIG. 15 is a view 1500 illustrating an equivalent circuit 1520 and a current-voltage characteristic graph 1510 of a hybrid phase FET according to one embodiment. The hybrid phase FET transistor has a metal-insulator phase transition material layer deposited over a source region, as described above. As shown in FIG. 15, the equivalent circuit 1500 of the hybrid phase transistor comprises a metal-insulator phase transition material layer resistance 1501 connected to a load resistance 1502. A gate electrode 1503 is connected via phase transition material layer resistance 1501 and load resistance 1502 to a source 1505. A drain 1504 is connected to gate electrode 1503. A supply voltage Vcc is applied to the drain 1504. A gate voltage Vg is applied to gate electrode 1503, and a source voltage Vs is applied to source 1505.

Graph 1510 shows a drain current $I_{dsat}$ 1512 versus a gate voltage Vg 1511 of the hybrid phase FET transistor according to one embodiment. As shown in graph 1510, the current-voltage characteristic has an ON curve 1515 and an OFF curve 1516. As shown in graph 1510, the hybrid phase transistor turns ON when the drain current is greater than a threshold current $I_{threshold}$ 1514 and a gate voltage is greater than a threshold voltage $V_{tg}$. The hybrid phase transistor operates in an active mode when the drain current is greater than a hold current $I_{hold}$ 1513. As shown in graph 1510, the hybrid phase transistor has a threshold voltage $V_{tg}$ substantially less than 0.3V. As shown in FIG. 15, ON curve 1515 of the hybrid phase FET transistor has a very steep sub-threshold slope due to a metal-insulator transition material integrated into a source contact region of the transistor. As shown in FIG. 15, OFF current of the hybrid phase FET transistor is set by high resistance of the metal-insulator transition material in insulating state; and ON current is set by maximum current that the hybrid phase FET transistor can drive.

Figure 16:
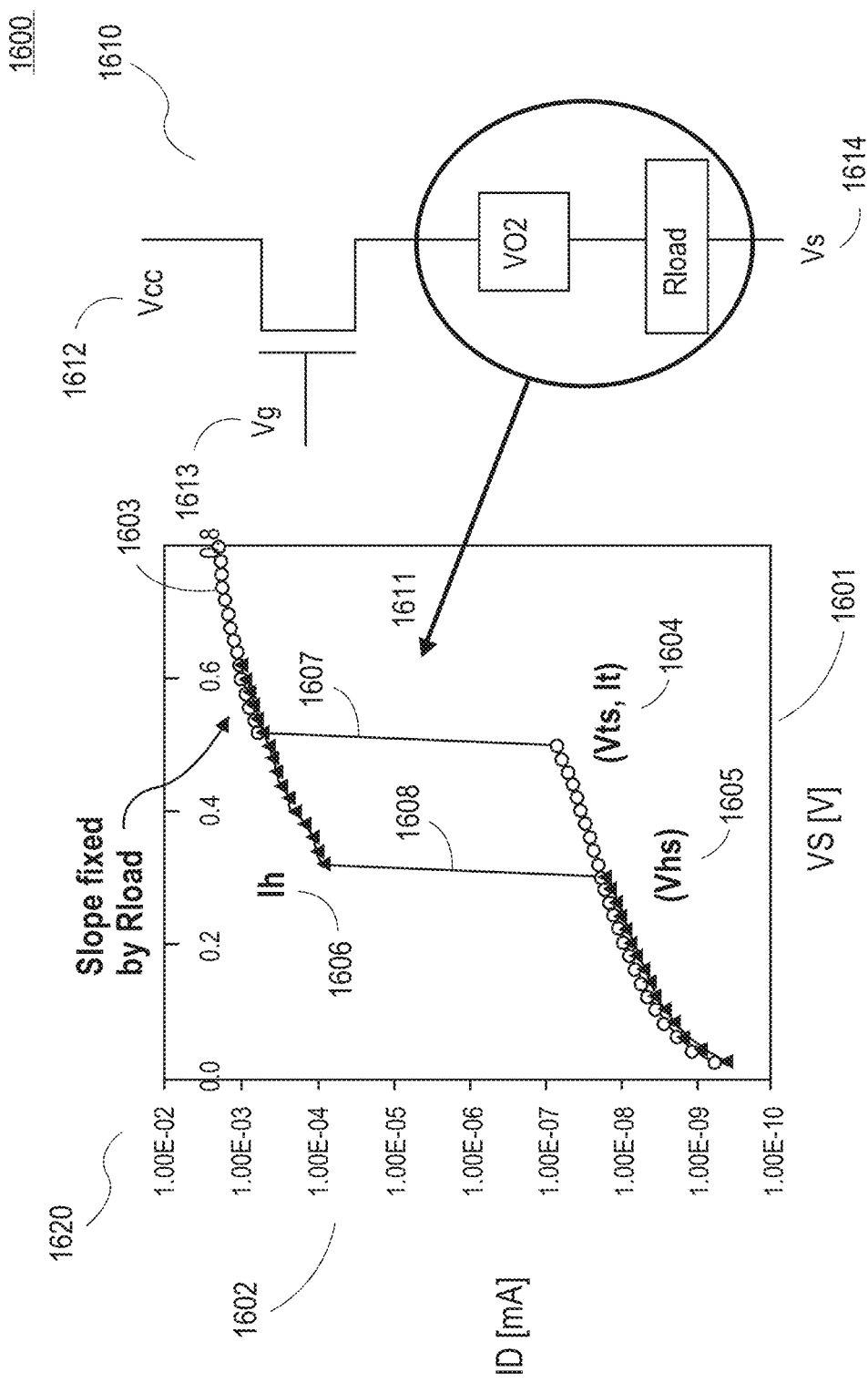
FIG. 16 is a view illustrating an equivalent circuit of the hybrid phase FET transistor and a graph illustrating a generic $VO_2$ two terminal current-voltage characteristic of a portion of the equivalent circuit according to one embodiment.

FIG. 16 is a view 1600 illustrating an equivalent circuit 1620 of the hybrid phase FET transistor and a graph illustrating a generic $VO_2$ two terminal current-voltage characteristic of a portion of the equivalent circuit according to one embodiment. The hybrid phase FET transistor has a metal-insulator phase transition material layer deposited over a source region, as described above. Equivalent circuit 1610 of the hybrid phase transistor comprises a metal-insulator phase transition material layer resistance ("VO2") connected to a load resistance Rload 1611. A gate electrode 1613 is connected via the phase transition material layer resistance and load resistance to a source 1614. A drain 1612 is connected to gate electrode 1503. A supply voltage Vcc is applied to the drain 1612. A gate voltage Vg is applied to gate electrode 1613. Application of the voltage to the phase transition material film transition the film from high resistance (insulating state) to a low resistance (metallic state).

The graph shows a drain current $I_d$ 1602 versus a source voltage Vs 1601 of a portion 1611 of the equivalent circuit of the hybrid phase FET transistor. The current-voltage characteristic has an OFF current curve 1608 and an ON current curve 1607. The current-voltage characteristic is defined by a hold source voltage Vhs 1605, a hold current 1606, a threshold source voltage Vts, and a threshold current Ih 1604. As shown on the graph, a slope 1603 of the ON curve 1607 of the current-voltage characteristic above Ih is fixed by Rload. As shown in the graph, ON current of the hybrid phase FET transistor determined by Rload is greater than $1 \times 10^{-3}$ mA. OFF current of the hybrid phase FET transistor set by high resistance of the metal-insulator transition material in insulating state is very low (less than $1 \times 10^{-8}$ mA). ON curve 1607 of the hybrid phase FET transistor has a very steep sub-threshold slope due to a metal-insulator transition material integrated into a source contact region of the transistor.

Figure 17:
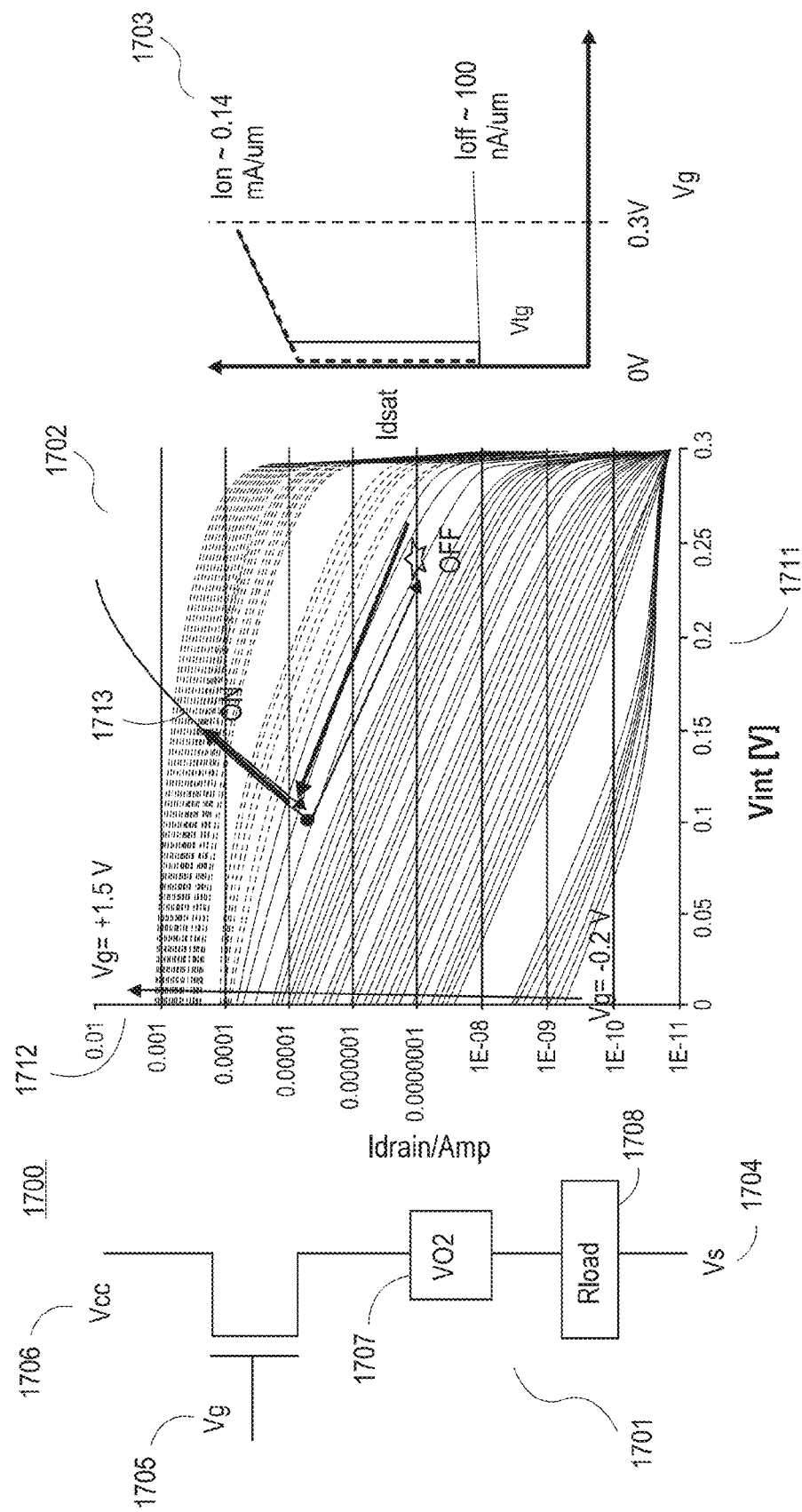
FIG. 17 is a view illustrating an equivalent circuit of the hybrid phase FET transistor, a graph illustrating a set of a drain current versus a source voltage characteristics of a hybrid phase FET transistor simulated using a metal-insulator phase transition material layer targeted to a threshold voltage of the transistor and a graph illustrating a drain saturation current versus a gate voltage characteristic of a simulated hybrid phase FET according to one embodiment.

FIG. 17 is a view 1700 illustrating an equivalent circuit 1701 of the hybrid phase FET transistor, a graph 1702 illustrating a set of a drain current versus a source voltage characteristics of a hybrid phase FET transistor simulated using a metal-insulator phase transition material layer targeted to a threshold voltage of the transistor and a graph 1703 illustrating a drain saturation current versus a gate voltage characteristic of a simulated hybrid phase FET according to one embodiment. The hybrid phase FET transistor has a metal-insulator phase transition material layer deposited over a source region, as described above. Equivalent circuit 1701 of the hybrid phase transistor comprises a metal-insulator phase transition material layer resistance ("VO2") 1707 connected to a load resistance Rload 1708. A gate electrode 1705 is connected via the phase transition material layer resistance 1707 and load resistance 1708 to a source 1704. A drain 1706 is connected to gate electrode 1705. A supply voltage Vcc is applied to the drain 1706. A gate voltage Vg is applied to gate electrode 1705. Application of the voltage to the phase transition material film transition the film from high resistance (insulating state) to a low resistance (metallic state).

The graph 1702 shows a set of a drain current $I_d$ 1712 versus a source voltage Vs 1711 characteristics of the hybrid phase FET transistor at different gate voltages (e.g., from Vg=−0.2 volts to Vg=+1.5 volts). The metal-insulator phase transition material is integrated into the source region of the transistor such that the transistor in ON state has the drain current greater than 0.001 A, and the transistor in OFF state has very low leakage current less than $1 \times 10^{-8}$ A, as shown in the graph 1702.

Graph 1703 shows a drain current $I_{dsat}$ versus a gate voltage Vg of the hybrid phase FET transistor according to one embodiment. As shown in graph 1703, the current-voltage characteristic has an OFF current Ioff of about 100 nA/μm and an ON current Ion of about 0.14 mA/μm. As shown in graph 1703, the current-voltage characteristic of the hybrid phase FET transistor has a very steep sub-threshold slope due to a metal-insulator transition material integrated into a source contact region of the transistor and a threshold voltage $V_{tg}$ substantially less than 0.3V.

Figure 18:
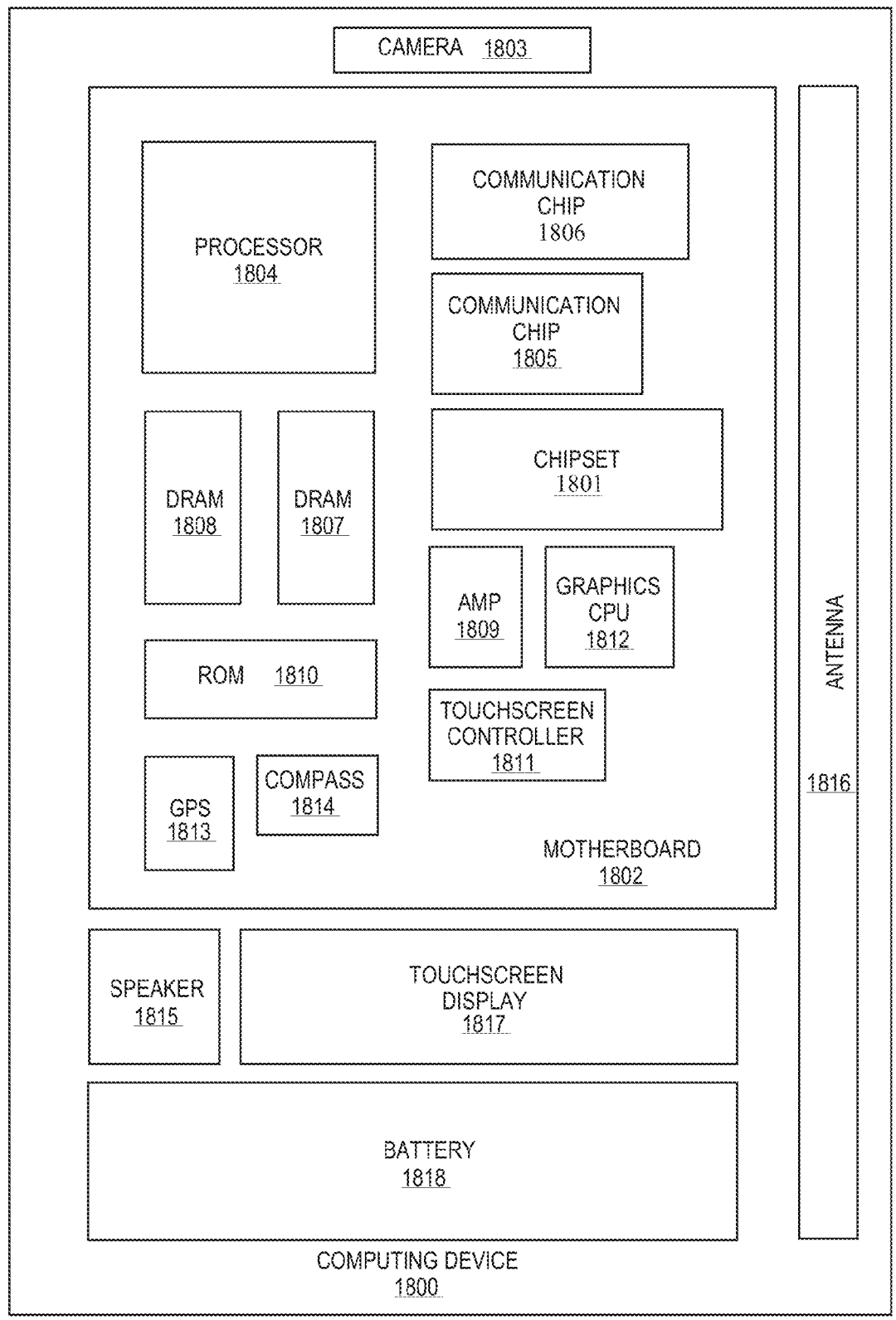
FIG. 18 illustrates a computing device in accordance with one embodiment.

FIG. 18 illustrates a computing device 1800 in accordance with one embodiment. The computing device 1800 houses a board 1802. The board 1802 may include a number of components, including but not limited to a processor 1804 and at least one communication chip 1806. The processor 1804 is physically and electrically coupled to the board 1802. In some implementations the at least one communication chip is also physically and electrically coupled to the board 1802. In further implementations, at least one communication chip 1806 is part of the processor 1804.

Depending on its application, computing device 1800 may include other components that may or may not be physically and electrically coupled to the board 1802. These other components include, but are not limited to, a memory, such as a volatile memory 1808 (e.g., a DRAM), a non-volatile memory 1810 (e.g., ROM), a flash memory, a graphics processor 1812, a digital signal processor (not shown), a crypto processor (not shown), a chipset 1801, an antenna 1816, a display, e.g., a touchscreen display 1817, a display controller, e.g., a touchscreen controller 1811, a battery 1818, an audio codec (not shown), a video codec (not shown), an amplifier, e.g., a power amplifier 1809, a global positioning system (GPS) device 1813, a compass 1814, an accelerometer (not shown), a gyroscope (not shown), a speaker 1815, a camera 1803, and a mass storage device (such as hard disk drive, compact disk (CD), digital versatile disk (DVD), and so forth) (not shown).

A communication chip, e.g., communication chip 1806, enables wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1800 may include a plurality of communication chips. For instance, a communication chip 1806 may be dedicated to shorter range wireless communications such as Wi-Fi and Bluetooth and a communication chip 1805 may be dedicated to longer range wireless communications such as GPS, EDGE, GPRS, CDMA, WiMAX, LTE, Ev-DO, and others.

In at least some embodiments, the processor 1804 of the computing device 1800 includes an integrated circuit die having a hybrid phase FET transistor according to embodiments described herein. The integrated circuit die of the processor includes one or more devices, such as transistors or metal interconnects as described herein. The term "processor" may refer to any device or portion of a device that processes electronic data from registers and/or memory to transform that electronic data into other electronic data that may be stored in registers and/or memory. In an embodiment, at least one the communication chips 1806 and 1807 also includes an integrated circuit die package having a hybrid phase FET transistor according to embodiments according to the embodiments described herein.

In further implementations, another component housed within the computing device 1000 may contain an integrated circuit die package having a hybrid phase FET transistor according to the embodiments described herein. In accordance with one implementation, the integrated circuit die of the communication chip includes one or more devices, such as transistors and metal interconnects, as described herein. In various implementations, the computing device 1800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1800 may be any other electronic device that processes data.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. An electronic device, comprising:
   a gate electrode on a substrate,
   a pair of source/drain regions on the substrate at opposite sides of the gate electrode;
   a pair of contact layers coupled to the pair of source/drain regions;
   a metallization layer that is a part of a back end metallization of the electronic device over the pair of contact layers;
   a trench in an insulating layer to expose a portion of the metallization layer; and
   a metal-insulator phase transition material layer on the portion of the metallization layer within the trench.

2. The electronic device of claim 1, wherein the metal-insulator phase transition material layer is formed to couple to only one of the two contact layers.

3. The electronic device of claim 1, wherein the metal-insulator phase transition material layer is on a first capping layer within the trench.

4. The electronic device of claim 3, wherein the first capping layer is formed on the portion of the metallization layer.

5. The electronic device of claim 1, wherein the metal-insulator phase transition material layer is coupled to the source region.

6. The electronic device of claim 1, wherein the metal-insulator phase transition material layer is coupled to the drain region.

7. The electronic device of claim 1, wherein the insulating layer is formed around the gate electrode, the contact layers, and the metal-insulator phase transition material layer.

8. The electronic device of claim 3, wherein the metal-insulator phase transition material layer is coupled to the source/drain region.

9. The electronic device of claim 1, wherein the metal-insulator phase transition material layer is sandwiched between the first capping layer and a second capping layer.

10. The electronic device of claim 1, wherein the thickness of the metal-insulator phase transition material layer is from 2 nanometers to 100 nm.

11. The electronic device of claim 1, wherein the metal-insulator phase transition material layer includes a transition metal oxide, an $ABO_3$ material, or any combination thereof.

12. The electronic device of claim 1, wherein the substrate comprises a semiconductor fin.

13. The electronic device of claim 1, wherein the metallization layer comprises a plurality of metallization layers.

* * * * *